United States Patent [19]

Krause

[11] 4,105,943

[45] Aug. 8, 1978

[54] INTEGRATED AMPLIFIER WITH NEGATIVE FEEDBACK

[75] Inventor: Gerhard Krause, Rosenheim, Egarten, Germany

[73] Assignee: Siemens Aktiengesellschaft, Berlin & Munich, Germany

[21] Appl. No.: 823,402

[22] Filed: Aug. 10, 1977

Related U.S. Application Data

[63] Continuation-in-part of Ser. No. 731,432, Oct. 12, 1976.

[30] Foreign Application Priority Data

Sep. 15, 1976 [DE] Fed. Rep. of Germany ....... 2641551

[51] Int. Cl.² .............................................. H03F 3/14
[52] U.S. Cl. ................................ 330/290; 307/299 B; 330/293; 330/299; 330/308; 330/311
[58] Field of Search ............... 330/290, 293, 299, 307, 330/308, 310, 311; 307/299 B; 357/36

[56] References Cited

U.S. PATENT DOCUMENTS

| 3,710,269 | 1/1973 | Fowler et al. | 330/293 |
| 3,725,683 | 4/1973 | Anderson | 307/299 B |
| 3,822,387 | 7/1974 | Mulder | 307/299 B |

FOREIGN PATENT DOCUMENTS 2,344,099  3/1975  Fed. Rep. of Germany.

OTHER PUBLICATIONS

IEEE Journal of Solid-State Circuits, vol. SC-7, No. 5, Oct. 1972, pp. 340-351.

Primary Examiner—James B. Mullins
Attorney, Agent, or Firm—Hill, Gross, Simpson, Van Santen, Steadman, Chiara & Simpson

[57] ABSTRACT

The dynamic input impedance of a feedback current amplifier is varied such that a matching to the characteristic impedance of a line feeding the amplifier is achieved. An integrated negative feedback current amplifier has at least two amplifier stages and one inverse coupling branch from the amplifier input to the amplifier output. The active element of the last amplifier stage has a divided output circuit such that the output current is divided between the inverse coupling branch and the amplifier output. The input DC current is selected such that the dynamic amplifier input impedance is adjusted to the characteristic impedance of a line feeding the amplifier.

3 Claims, 1 Drawing Figure

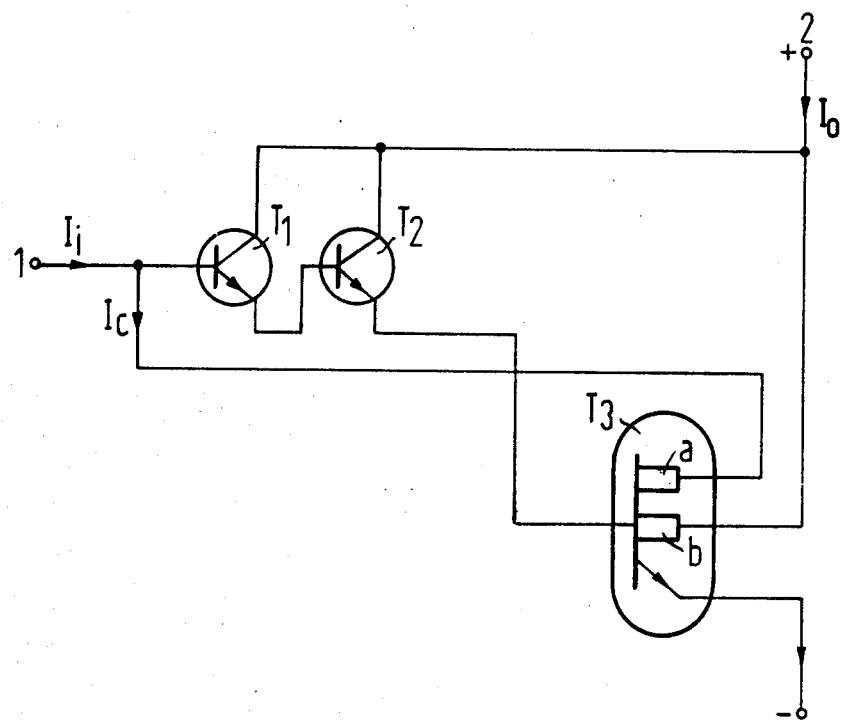

INTEGRATED AMPLIFIER WITH NEGATIVE FEEDBACK

RELATED APPLICATION

This case is a continuation-in-part of my co-pending case titled "INTEGRATED DEGENERATIVE AMPLIFIER", U.S. Ser. No. 731,432, filed Oct. 12, 1976 claiming a priority date of Nov. 5, 1975.

BACKGROUND OF THE INVENTION

The present invention relates to an integrated circuit amplifier with negative feedback, in particular a current amplifier, having at least two amplifier stages, wherein a negative feedback arm connects from the amplifier output to the amplifier input, and wherein the output circuit of the active element of the last amplifier stage is divided up in such manner that a sub-current is conveyed into the negative feedback arm and a sub-current is conveyed into the amplifier output. Such a circuit is described in co-pending U.S. Ser. No. 731,432.

Integrated amplifiers with negative feedback of the type described above may be used, for example, as line amplifiers, in which case an amplifier is connected into the line at periodic intervals.

SUMMARY OF THE INVENTION

An object of the present invention is to vary the dynamic input impedance of amplifiers of the type described in my co-pending case U.S. Ser. No. 731,432 in such manner that the characteristic impedance can be adapted to a line which feeds the amplifier, such as in antenna amplifiers.

This object is realized in an integrated amplifier exhibiting negative feedback in accordance with the invention in that the value of the input d.c. current which determines the amplifier operating point is selected to be such that the dynamic amplifier input impedance is matched to the characteristic impedance of a line having the input signal thereon, where the amplifier input current is governed by the equation $$I_i = kT/eZ$$

where
- $k$ is the Boltzmann constant,
- $T$ is the absolute temperature,
- $e$ is the elementary charge, and
- $Z$ is the characteristic impedance of the line which supplies the signal to be amplified.

BRIEF DESCRIPTION OF THE DRAWING

The drawing illustrates a circuit diagram of an amplifier designed in accordance with the invention.

DESCRIPTION OF THE PREFERRED EMBODIMENTS

In accordance with the drawing, an amplifier corresponding to the invention contains two amplifier stages having transistors $T_1$ and $T_2$, which are connected as a Darlington stage. An input current $I_i$ which is to be amplified is fed into the amplifier at a terminal 1. The Darlington stage is followed by a transistor $T_3$ which is provided with two collectors $a$ and $b$. The path formed by the collector $b$ and the emitter of this transistor represents the output circuit of the amplifier from which an output current $I_0$ can be withdrawn at an output terminal 2. The other collector $a$ leads back to the input 1 of the amplifier, whereby a negative feedback arm is formed. The operating voltage is fed in at the terminal likewise reference +, possibly via a load resistor which has not been illustrated.

From the input current $I_i$ which is to be amplified, there is branched off a current $I_c$ which flows to the current divider transistor $T_3$. The remainder of this current is amplified in the transistors $T_1$ and $T_2$ which are connected as a Darlington stage. The output current from the Darlington stage flows into the base of the transistor $T_3$. The polarity of the current feedback from the collector $a$ corresponds to a negative feedback, whereas the collector $b$ supplies the amplified output current. The current ratio is determined by the current transmission factors of the two collectors. This ratio remains constant to a close approximation, i.e., for a large range of input current, temperature, and frequency, the amplifier having negative feedback exhibits a virtually constant amplification without the need to use a component to establish negative feedback.

Particularly in wide-band transmission systems, it is necessary to connect a line with an associated characteristic impedance to the amplifier input 1 to supply the signal to be amplified. For this purpose, the input d.c. which determines the operating point of the amplifiers is selected to be such that the differential or dynamic amplifier input impedance is equal to the characteristic impedance of the line. The input d.c. current which is supplied by the operating voltage connected to the terminal 2 should, for this purpose, be set to be such that the input current $$I_i = kT/eZ$$

where
- $k$ is the Boltzmann constant,
- $T$ is the absolute temperature,
- $e$ is the elementary charge and
- $Z$ is the characteristic impedance of the line which feeds the amplifier.

The invention does not absolutely require that the input d.c. current required for matching should be supplied by a battery voltage, as shown in the embodiment of the drawing. In accordance with the other possibilities of setting the operating point which are described in U.S. Ser. No. 731,432, it is also possible to provide a light irradiation of the active elements, the mode of operation of which is described in detail in "IEEE Journal of Solid State Circuits," Vol. SC7, No. 5, October 1972, P340, to 351, and in the German Offenlegungsschrift 2,344,099, pages 10 through 12.

On the other hand, the current can also be supplied by an injecting pn-junction which makes available the requisite charge carriers. This possibility is likewise described in detail in U.S. Ser. No. 731,432.

Both when the current is supplied by light irradiation and by means of an injecting pn-junction, the operating point is set in the above described manner in order to match the characteristic impedance of a line which supplies the signal to be amplified.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An integrated current amplifier having negative feedback comprising: at least two amplifier stages, a negative feedback arm connected from the amplifier output to the amplifer input, and the output circuit of an active element of a last amplifier stage is divided so as to produce a division of the output current such that a portion of the current is conveyed into the negative feedback arm and a portion of the current is conveyed into the amplifier output, and d.c. input current means associated with the amplifier stages, the value of an input d.c. current supplied by the current means which determines the amplifier operating point being selected such that the dynamic amplifier input impedance is matched to the characteristic impedance of a line which supplies an input signal, the amplifier input current ($I_i$) being governed by the equation $$I_i = kT/eZ$$

where
   $k$ is the Boltzmann constant,
   $T$ is the absolute temperature
   $e$ is the elementary charge and
   $Z$ is the characteristic impedance of the line which supplies the signal to be amplified.

2. The integrated current amplifier of claim 1 in which said d.c. input current means comprises a DC power source connected to said amplifier stages.

3. An integrated current amplifier having negative feedback, comprising:
   a Darlington circuit having an input, current supply terminal, and an output;
   an output transistor stage having a base, first and second current dividing terminals, and an emitter, said base connecting with said Darlington circuit output;
   a negative feedback path from said output transistor stage first terminal to said Darlington circuit input;
   power source means connected to said output stage emitter, second current dividing terminal, and Darlington circuit current supply terminal;
   means for establishing a d.c. input current at said Darlington circuit input such that the amplifier input impedance is matched to the characteristic impedance of an input signal line connected to the Darlington circuit input, the amplifier current being selected, according to the equation $I_i = kT/eZ$ where
   $k$ is the Boltzmann constant,
   $T$ is the absolute temperature
   $e$ is the elementary charge and
   $Z$ is the characteristic impedance of the line which supplies the signal to be amplified.

* * * * *